United States Patent
Bol et al.

(10) Patent No.: US 7,462,908 B2
(45) Date of Patent: Dec. 9, 2008

(54) DYNAMIC DEEP DEPLETION FIELD EFFECT TRANSISTOR

(75) Inventors: Igor Bol, Sherman Oaks, CA (US); Xin Li, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 387 days.

(21) Appl. No.: 11/181,292

(22) Filed: Jul. 14, 2005

(65) Prior Publication Data
US 2006/0017100 A1   Jan. 26, 2006

Related U.S. Application Data
(60) Provisional application No. 60/587,745, filed on Jul. 14, 2004.

(51) Int. Cl.
*H01L 29/76* (2006.01)
(52) U.S. Cl. .......... 257/328; 257/330; 257/331
(58) Field of Classification Search .......... 257/328, 257/330, 331
See application file for complete search history.

(56) References Cited

U.S. PATENT DOCUMENTS

| | | | |
|---|---|---|---|
| 2002/0102795 A1* | 8/2002 | Calafut | 438/259 |
| 2005/0167742 A1* | 8/2005 | Challa et al. | 257/328 |
| 2005/0199918 A1* | 9/2005 | Calafut et al. | 257/260 |
| 2006/0261405 A1* | 11/2006 | Forbes | 257/328 |

* cited by examiner

*Primary Examiner*—Edward Wojciechowicz
(74) *Attorney, Agent, or Firm*—Ostrolenk, Faber, Gerb & Soffen, LLP

(57) ABSTRACT

A vertical conduction trench FET has a plurality of trenches containing conductive polysilicon gates. The mesas between the trenches have a source diffusion region connected to a common source electrode. The trenches are spaced so that the depletion regions induced by the trench gate will overlap to pinch off conduction through the mesa to turn off the device. The gate potential is pulsed. The polysilicon in the trenches may be separated into two insulated portions. The pulses may be applied simultaneously or sequentially to the polysilicon gates.

8 Claims, 5 Drawing Sheets

DYNAMIC DEEP DEPLETION FIELD EFFECT TRANSISTOR

RELATED APPLICATIONS

This application claims the benefit and priority of U.S. Provisional Application No. 60/587,745, filed Jul. 14, 2004, the entire disclosure of which is incorporated by reference herein.

FIELD OF THE INVENTION

This invention relates to field effect transistors (FETs) and more specifically to a trench type FET in which the mesas between the trenches are dynamically depleted by gate structures to turn off the device.

BACKGROUND OF THE INVENTION

Enhancement trench type power MOSFETs are well known. Such devices employ a conventional base or channel region which is inverted by gate potential applied to polysilicon gates buried in the trenches and insulated from the trench walls by a gate oxide or other oxide layers.

In the Depletion Trench MOSFET it is the accumulation region (as opposed to inversion region) that provides the device conduction as well as the bulk of the mesa.

The impurity concentration of the mesa regions and the body below the trenches in such devices is relatively low in order to provide a suitable blocking voltage when the device is off, and to allow use of a low threshold gate voltage for turning the device on. This low body concentration, however, increases the device on-resistance $R_{DSON}$.

BRIEF SUMMARY OF THE INVENTION

In accordance with the invention, a buried insulated gate JFET is formed in which the body mesa and body doping level is substantially increased and the device is turned off by dynamically creating overlapping depletion regions extending from buried gates in the adjacent trenches.

In accordance with the invention, termed a dynamic deep depletion FET (DDDFET or $D^3$ FET), spaced gates are pulsed, producing overlapping depletion regions in the mesas between gate trenches. This then permits reduced $R_{DSON}$ because the dynamic mode turn off permits a higher epi concentration in the silicon base while still blocking the current along the channel.

The gates may be simultaneously pulsed or alternately pulsed with voltages that allow the deep depletion to form. This device takes advantage of the known phenomenon that the depletion region at a MOS gate extends momentarily (tens of milliseconds) well beyond Wd at the threshold voltage.

For example: for 2E16 cm-3 epi doping level, the depletion width at the threshold (1V) is only about 0.12 μm (due to the shielding effect of the inversion layer formed at Vt and above). This 0.12 micron depletion width is not nearly enough to block 0.5 μm channel for 0.5/0.5 pitch layout. But if pulsed with 4-10 volts it extends to over 0.5 micron, it is wide enough to block the channel and provide high blocking voltage.

Other advantages of the device of the invention include:
  Simplicity of the process integration. There are fewer layers required for this device as compared to trench MOSFET.
  Higher cell density again compared to a conventional MOSFET since there is no need for the body contact.

In Enhancement Trench MOSFET (regular Trench MOSFET that is the only MOSFET currently used in the power device industry) the mesa body is P-doped while source and drain are N+ doped. It takes gate voltage above the threshold voltage to invert (to N type) a sliver (about 200 A) of P-type body along the gate oxide to electrically connect N+ source to N+ drain. The inverted layer that is connecting Source and Drain is called the channel. The device is also called a normally "OFF" device.

In the depletion trench device there is N+ source, N body or mesa and the N+ drain. So the source and the drain are already electrically connected (N+ to N to N+). In this case it is not the inverted sliver of P-doped mesa that is conducting but the whole body of mesa. So in the enhancement device the channel is the inverted sliver. In this device the whole mesa is the channel. The device is normally "ON" and it takes the threshold voltage to shut it off and provide the blocking.

So in the D3 FET the whole mesa is the channel but in the Enhancement Trench FET only a sliver of mesa along the gate is the channel and the rest of the P-type mesa is called a BODY.

Other possible implementations of the invention include the laterally alternately pulsed interlaced gates and vertically alternately pulsed gates when trenches are filled with two independent, electrically isolated poly layers. These layers may be stacked one on top of another.

BRIEF DESCRIPTION OF THE PREFERRED EMBODIMENTS

DETAILED DESCRIPTION OF THE PREFERRED EMBODIMENTS

Figure 1:
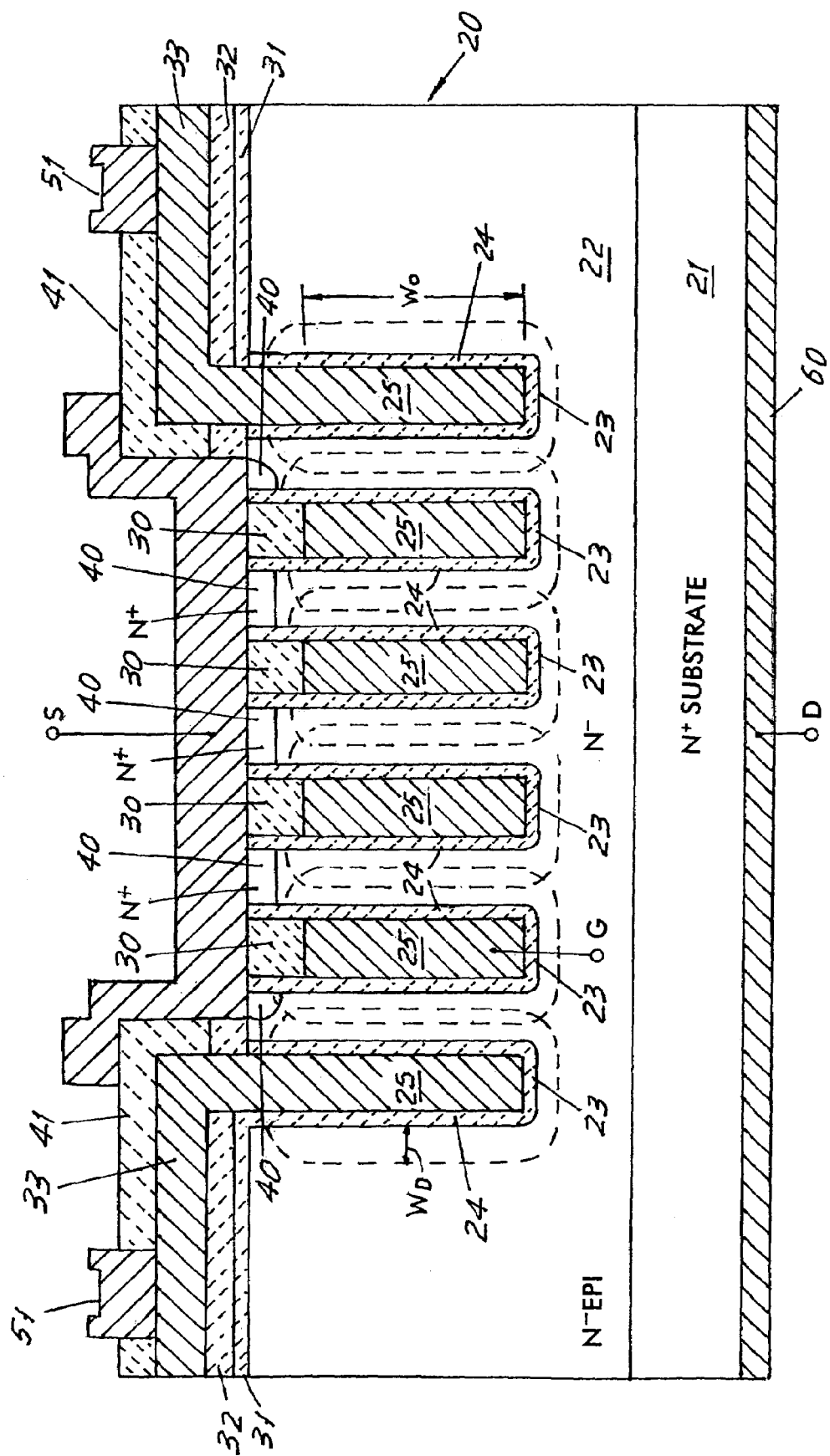
FIG. 1 is a cross-section of a small section of a FET die constructed in accordance with the invention.

Referring first to FIG. 1, there is shown in a cross section, a small portion of a die made in accordance with the invention. The die is one of a plurality of die which are formed in a parent wafer which is singulated after processing is completed. The terms die and wafer may be used interchangeably.

Thus, a wafer or die 20 of monocrystaline silicon has an N+ substrate 21 of any desired thickness, and has an N− junction receiving region 22 which is commonly epitaxially deposited on substrate 21.

A plurality of trenches 23 (only 6 of which are shown in FIG. 1) each have silicon dioxide gate oxides 24 grown on their interiors, and conductive polysilicon masses 25 fill the trenches for a portion of their height (shown as Wo) from the bottom of their trench. The trench bottoms may also contain a thicker oxide than that of the gate oxide on the trench walls. TEOS or other insulation caps 30 fill the remainder of the height of the 4 central control gate trenches 23.

The outermost trenches 23 to the extreme left and right of all 6 trenches 23 have their polysilicon fillers 25 extending upward and over oxide/nitride layers 31/32 as plate extensions 33, to serve as shields and field plates. The intent of this segment of the drawing is to show how the contact to polysilicon can be made and is for illustrative purpose only. The general layout of the cells of DDDFET device is no different from any other trench device, that is, there are thousands parallel strips of trenches filled with polysilicon all connected together with one or few poly buses running across, in a comb like structure.

An $N^+$ source diffusion 40 extends across the top of layer 22 and extends over the area occupied by the central 4 trenches 23 shown (hundreds of such trenches could be present in the product.)

A TEOS interlayer 41 overlies the outer polysilicon plates 33 and a source contact 50 and insulated contacts 51 are applied over the upper surface. Source contact 50 contacts the source region 40 and contacts 51 contact plates 33.

The purpose of contact 51 is to contact the poly gates to metal that is connected to a pad.

A drain contact 60 is then connected to the bottom of substrate 21.

It will be noted that a buried insulated gate JFET is formed in FIG. 1 in which the $N^-$ body doping level in region 22 and the distance between the gate electrodes 25 in the trenches 23 are matched in such a way as to produce overlapping depletion areas, shown in dotted lines in FIG. 1, at a particular voltage on the gate (the blocking voltage).

In accordance with the invention, the depletion column gates are pulsed either simultaneously or alternately, producing a reduced $R_{DSON}$ because the dynamic mode permits a higher epi concentration in the silicon base while still blocking the voltage along the channel.

The epi N– doping level in region 22 and the distance between the gate electrodes are matched in a such way as to produce overlapping depletion areas, shown in dotted lines, at a so called blocking voltage. At the gate voltages below the blocking voltage the device conducts.

The device is a majority carrier device with very high bulk carrier mobility (1400 cm$^2$ Vsec) which helps to reduce $R_{DSON}$.

Further, the device has a much faster switch speed than conventional MOSFET due to the absence of recombination of minority carriers.

It will be noted that the device does not have a body (buried P-type doped layer) channel (body) element and as result does not need to have it connected to the source thus allowing much higher cell density and process simplicity.

Further improvements in device performance can be achieved by using a $Si_2O_4/Si_3N_4$ sandwich gate to increase gate breakdown voltage.

Figure 9:
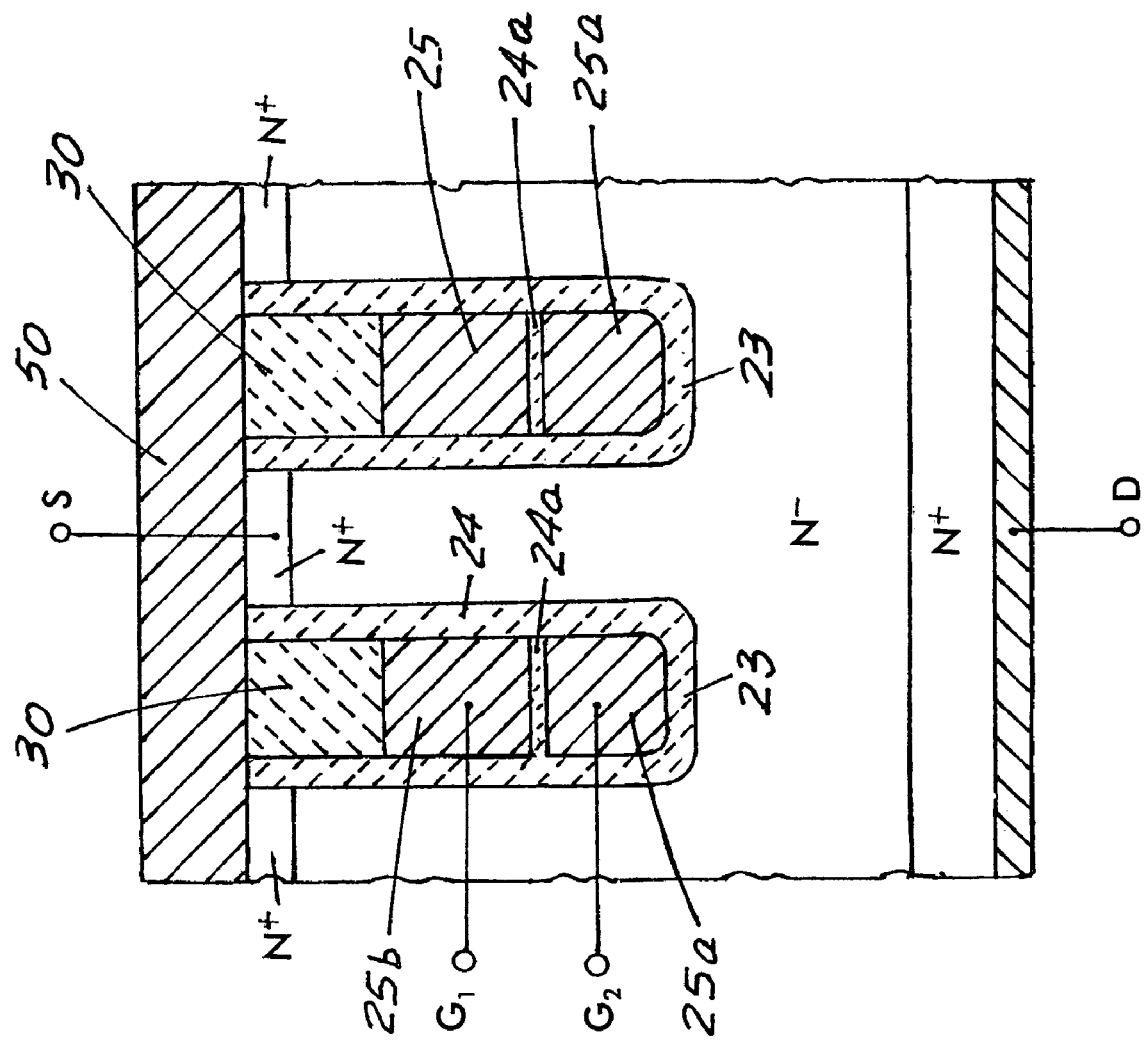
FIG. 9 shows an embodiment of the invention in which each of the trenches of FIGS. 1 and 8 contain two insulated polysilicon gates.

As shown in FIG. 9, the central trenches 23 may contain 2 insulated conductive polysilicon masses 25a and 25b insulated by oxide layer. These masses 25a and 25b may have a height of about 1 micron each. While shown one atop the other, they can be otherwise oriented.

The device will then have much lower $R_{DSON}$ because the dynamic mode allows the use of a much higher doped epi and still block the channel.

More specifically, the gates are pulsed with a voltage sufficiently high that allow the Deep Depletion to form. This device takes advantage of the known phenomenon that the depletion region at a MOS gate extends momentarily (tens of milliseconds) well beyond Wd at the threshold voltage.

For example: for 2E16 cm-3 epi doping level, the depletion width at the threshold (1V) is only about 0.112 μm (due to the shielding effect of the inversion layer formed at Vt and above). This 0.12 micron depletion width is not nearly enough to block 0.5 μm channel for 0.5/0.5 pitch layout. But if pulsed with 4-10 volts it extends to over 0.5 micron, it is wide enough to block the channel and provide high blocking voltage.

The dynamic deep depletion FET ($D^3$FET) of the invention will have a much lower $R_{DSON}$ because the dynamic mode allows use of a much higher doped epi and still block the channel.

The other advantages of the device of the invention include:

Simplicity of the process integration in that there are fewer layers required for this device as compared to trench MOSFET.

Higher cell density again compared to MOSFET since there is no need for the body contact.

FIGS. 2 to 8 show one manufacturing process for making the device of the invention. In these Figures, the same numeral designates the same or similar elements used elsewhere in the drawings and specification.

Figure 2:
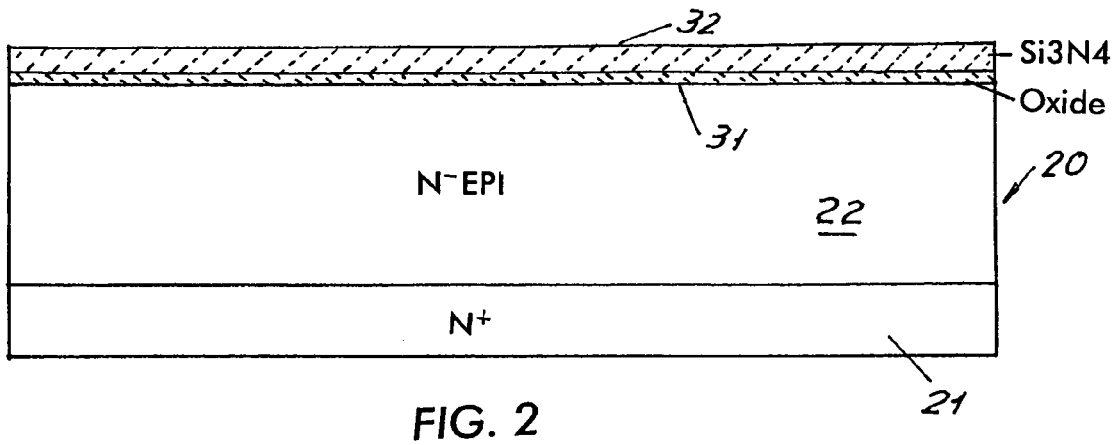
FIG. 2 is a cross-section of the starting wafer for making the device of FIG. 1 after initial oxidation and nitride deposition steps.

FIG. 2 shows the starting Wafer 20 with epitaxially deposited layer 22. In a first step, a thin oxide 31, for example a 200 Å thick oxide (non-critical) is grown on the top surface of region 22 and a $Si_3 N_4$ nitride layer 32, which may have a non-critical thickness of about 1500 Å to 3000 Å, is deposited atop layer 31.

Figure 3:
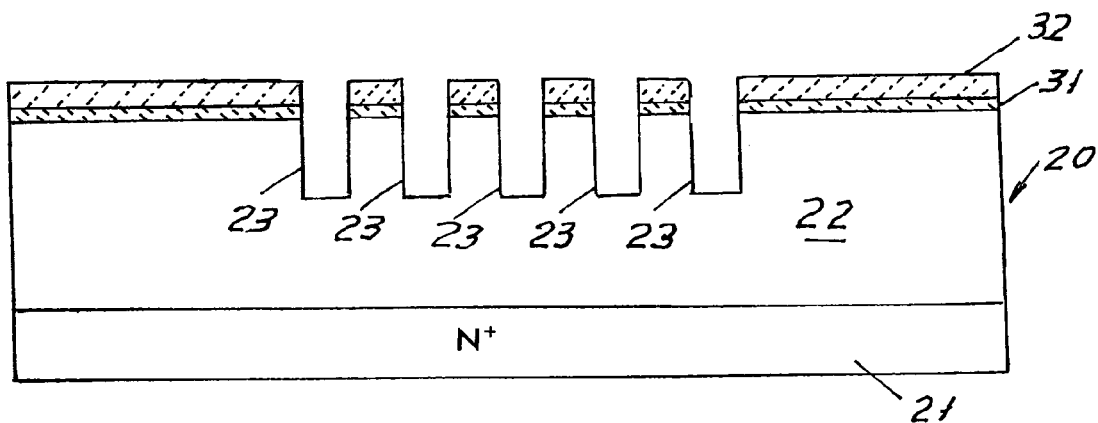
FIG. 3 shows the wafer of FIG. 2 after a trench mask step and the formation of a plurality of trenches into its top surface.

FIG. 3 shows a first mask step (the trench mask), in which a photo mask (not shown) is formed atop layer 32 and is conventional processed to open windows. A trench etch, which may be as deep as desired, for example 1.5 to 2.5 microns deep, preferably 2.5 microns, is then carried out to define trenches 23. The photoresist is then stripped. The trenches may be cellular or parallel strips.

Figure 4:
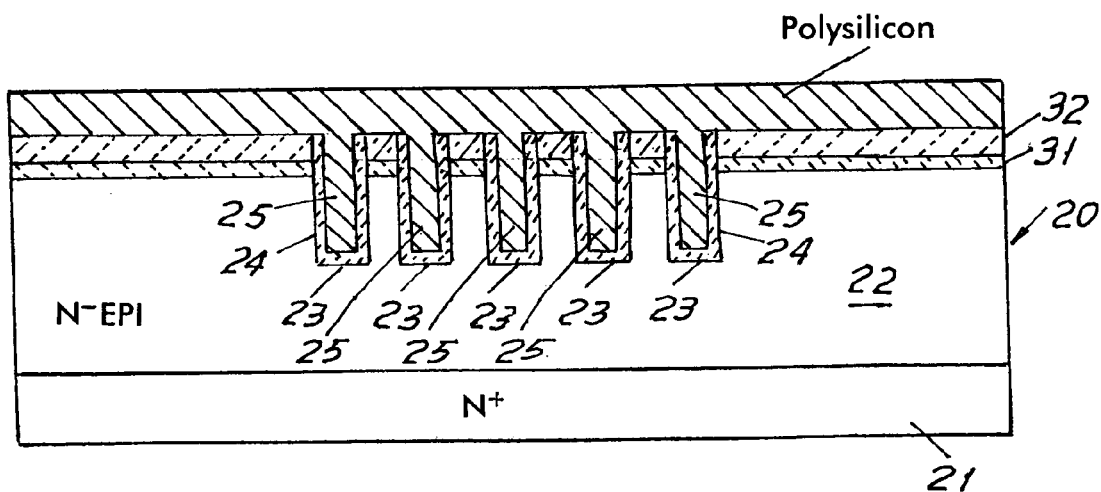
FIG. 4 shows the wafer of FIG. 3 after gate oxidation and polysilicon deposition steps.

Thereafter, and as shown in FIG. 4, a gate oxide 23 is grown in the trenches to a thickness of about 350 Å to 500 Å preferably about 400 Å. Conductive polysilicon is then deposited atop the wafer surface to a thickness of about 7000 Å and into trenches 23, forming polysilicon fillers 25, and is conventionally densified.

Figure 5:
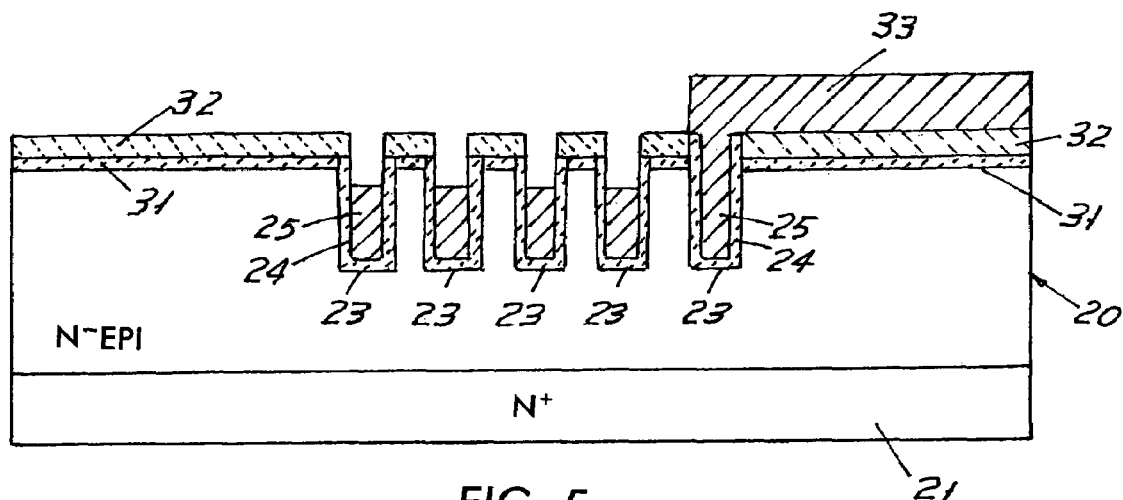
FIG. 5 shows the wafer of FIG. 4 after a polysilicon mask step and polysilicon etch-back and oxidation.

In the next mask step, shown in FIG. 5, a mask (not shown) is formed atop the wafer and is processed to open windows to the polysilicon and a polysilicon plasma etch, etches the polysilicon back as shown, reducing the height of the polysilicon 25 in the trenches and defining plates 33.

Thereafter, the polysilicon is exposed to an oxidation step, growing an oxide of 200 Å to 400 Å thick (not shown).

Figure 6:
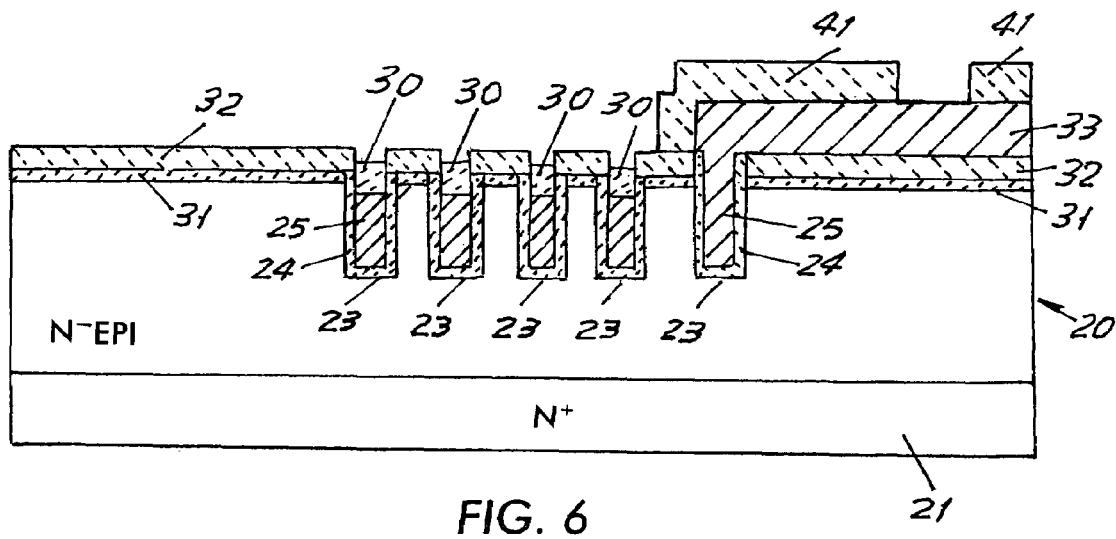
FIG. 6 shows the wafer of FIG. 6 after TEOS deposition, a contact mask step and a TEOS etch and resist stip.

As shown in FIG. 6, a layer of TEOS or LTO 5000 Å to 9000 Å thick (preferably 9000 Å of TEOS) is deposited atop the wafer, and the next photomask process (a contact mask) is carried out to etch all TEOS except region 41 from the wafer surface. The photo resist is then stripped.

Figure 7:
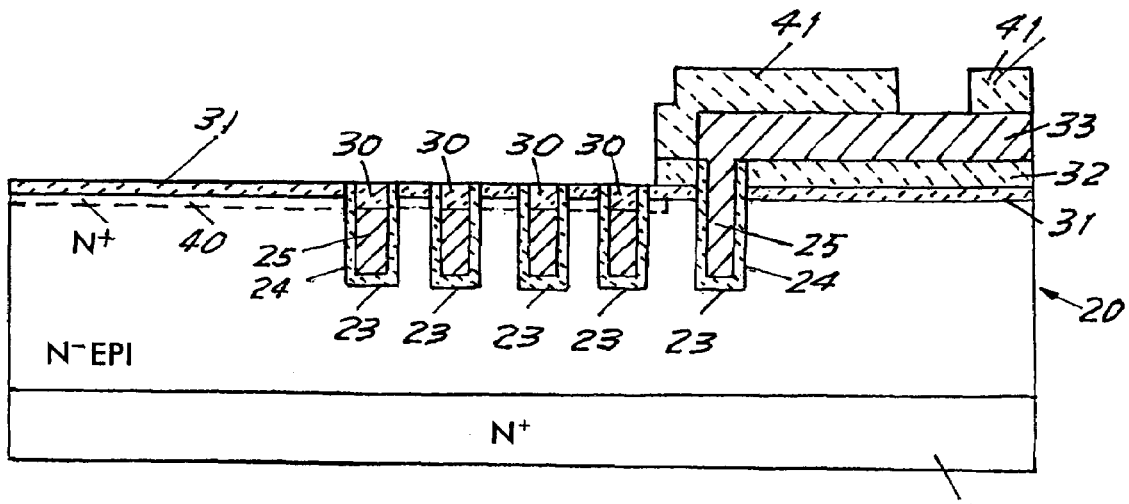
FIG. 7 shows the wafer of FIG. 6 after a nitride etch and an N+ implant and anneal step.

In the next process step, and as shown in FIG. 7, the nitride 32 which is exposed in the contact mask step of FIG. 6 is removed by a wet etch. An $N^+$ implant step is then carried out to form a source region. This implant may be As at a dose of 5E15 at 120 kV. The implant is then annealed at 920° C. to 950° C., forming $N^+$ source region 40.

Figure 8:
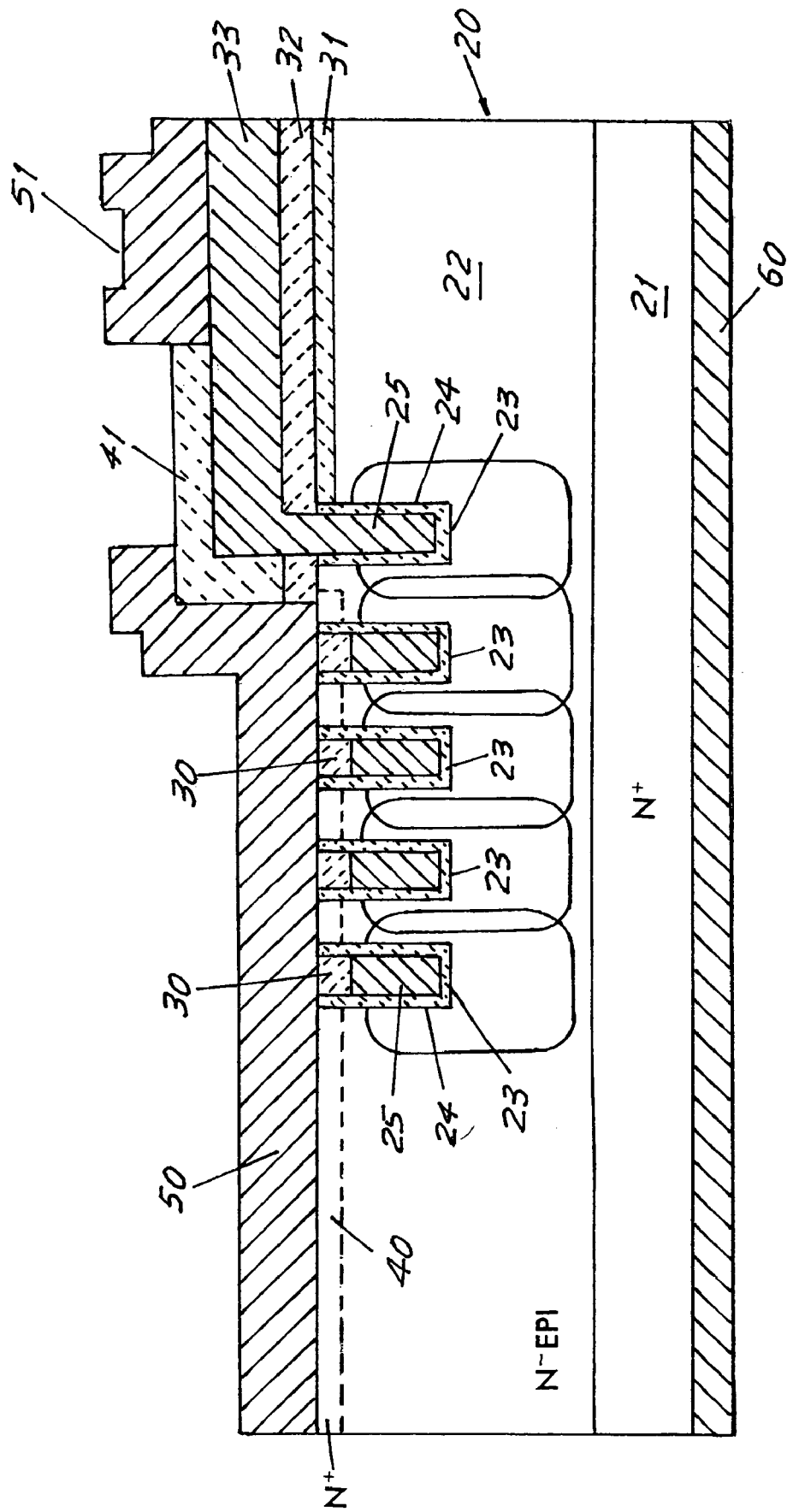
FIG. 8 shows the wafer of FIG. 7 after a metal deposition and sputter step, and metal patterning, forming the device of FIG. 1.

Thereafter, and a shown in FIG. 8, a preclean (oxide etch) step removes oxide 31 and prepares the wafer surface for a metal sputter and metal patterning step, forming electrodes 50 and 51.

A bottom drain electrode 60 is then conventionally formed.

The same basic process is used for the embodiment of the invention shown in FIG. 9, with appropriate modification, to form the polysilicon gates 25*a* and 25*b* which may be alternately pulsed. Thus, the trench depth for trenches 23 is preferably 2.5 microns; the gate oxide 24 is about 700 Å thick; there will be a first poly deposition and etch back to form poly regions 25*a* and a poly oxidation to form oxide 24*a*; a second poly deposition and etch back to form poly regions 25*b*; and a second and thin polyoxidation (200 Å). The process then continues as in FIGS. 6, 7 and 8.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor switching device comprising a semiconductor die of only one conductivity type formed over a substrate of said one conductivity type and having a plurality of equally spaced trenches, each pair of said trenches including a depletable region of only one conductivity type therebetween; a gate insulation lining at least a portion of the walls of said trenches; a conductive polysilicon mass disposed within each said trench for a height from the bottom of said trench; a source region of said one conductivity type but lower resistivity than said semiconductor die atop each depletable region; a source contact disposed in contact with said source regions and insulated from said conductive polysilicon masses; said polysilicon masses being connectable to a source of gate to source bias to receive pulse voltages; wherein said width and conductivity of said depletable regions are configured such that said depletion regions are generated around each trench and overlap one another inside each depletable region to deplete said depletable regions when said pulse voltages are applied to said polysilicon masses.

2. The device of claim 1, wherein said mesa regions have a doping level of about $2E16/cm^2$ and wherein said pulse voltages create said depletion regions in the order of 10s of milliseconds after the application of a pulse.

3. The device of claim 1, wherein said mesas have a width that is optimized for the selected channel doping level.

4. The device of claim 3, wherein said trenches have a width of about 0.3 to 0.5 microns.

5. The device of claim 3, wherein said pulse voltages are in the range of 4 to 10 volts.

6. The switching device of claim 1, wherein each said polysilicon mass is divided into first and second insulated masses.

7. The device of claim 1, wherein said pulse voltages are provided simultaneously.

8. The device of claim 3, wherein said pulse voltages are provided alternately.

\* \* \* \* \*